(12) United States Patent
Gao

(10) Patent No.: US 11,963,332 B2
(45) Date of Patent: Apr. 16, 2024

(54) CONTAINMENT SOLUTION FOR PHASE CHANGE SYSTEMS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 118 days.

(21) Appl. No.: 17/468,946

(22) Filed: Sep. 8, 2021

(65) Prior Publication Data
US 2023/0073646 A1    Mar. 9, 2023

(51) Int. Cl.
H05K 7/20    (2006.01)

(52) U.S. Cl.
CPC ........ H05K 7/20327 (2013.01); H05K 7/203 (2013.01); H05K 7/20318 (2013.01); H05K 7/20818 (2013.01)

(58) Field of Classification Search
CPC .............. H05K 7/203; H05K 7/20809; H05K 7/20318; H05K 7/20327; H05K 7/20236; H05K 7/20836; H05K 7/20381; H05K 7/208; H05K 7/2079; H05K 7/20309; H05K 7/20281; F28D 15/0266; F28D 2021/0028; G06F 1/20; G06F 2200/201
USPC .......... 361/700, 679.53, 699, 702, 704, 689, 361/698, 719; 165/104.33, 80.4, 104.21; 257/715, 714, 686
See application file for complete search history.

(56) References Cited

U.S. PATENT DOCUMENTS

| | | | |
|---|---|---|---|
| 2010/0307716 A1* | 12/2010 | Bean, Jr. ............ | H05K 7/20745 165/80.2 |
| 2011/0278998 A1* | 11/2011 | Caveney ............ | H05K 7/20745 312/109 |
| 2015/0334880 A1* | 11/2015 | Best ................... | H05K 7/20836 361/679.47 |
| 2016/0270263 A1* | 9/2016 | Crawford ............ | H04L 41/0803 |
| 2018/0066859 A1* | 3/2018 | Nguyen ............. | H05K 7/20709 |
| 2019/0373779 A1* | 12/2019 | Roy .......................... | G06F 1/20 |
| 2021/0059079 A1* | 2/2021 | Keehn ................ | H05K 7/20327 |
| 2022/0078942 A1* | 3/2022 | Bennett ............. | H05K 7/20281 |
| 2022/0167523 A1* | 5/2022 | Dumas ............... | H05K 7/20145 |
| 2023/0209773 A1* | 6/2023 | Alissa ................ | H05K 7/20327 361/505 |

* cited by examiner

*Primary Examiner* — Mandeep S Buttar
(74) *Attorney, Agent, or Firm* — WOMBLE BOND DICKINSON (US) LLP

(57) ABSTRACT

Methods, systems, and devices for managing coolant in data centers are disclosed. Coolant may be used in data centers to regulate the temperatures of computing devices. The disclosed methods and system may provide for containment of vapor and condensation of the vapor into coolant. The coolant may be used as part of a two phase cooling system to cool the computing devices. The vapor may be generated when the coolant removes heat from computing devices during operation while at least partially submerged in the coolant. A mobile condenser is used for condensing the vapor within the containment.

18 Claims, 13 Drawing Sheets

CONTAINMENT SOLUTION FOR PHASE CHANGE SYSTEMS

FIELD OF THE INVENTION

Embodiments of the present invention relate generally to data center cooling. More particularly, embodiments of the invention relate to containment and management of two phase coolant used in data center cooling.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is employed for normal operations of these servers in data centers, as well as the server performance and lifetime. It requires more effective and efficient cooling solutions especially in the cases of cooling these high performance servers.

Containment is also another consideration in computer system and data center design. Loss of materials from computer systems and data centers may reduce the performance of such systems or render them unable to perform their functions. Containment solutions may also provide efficient methods for managing the flow of coolant within data centers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
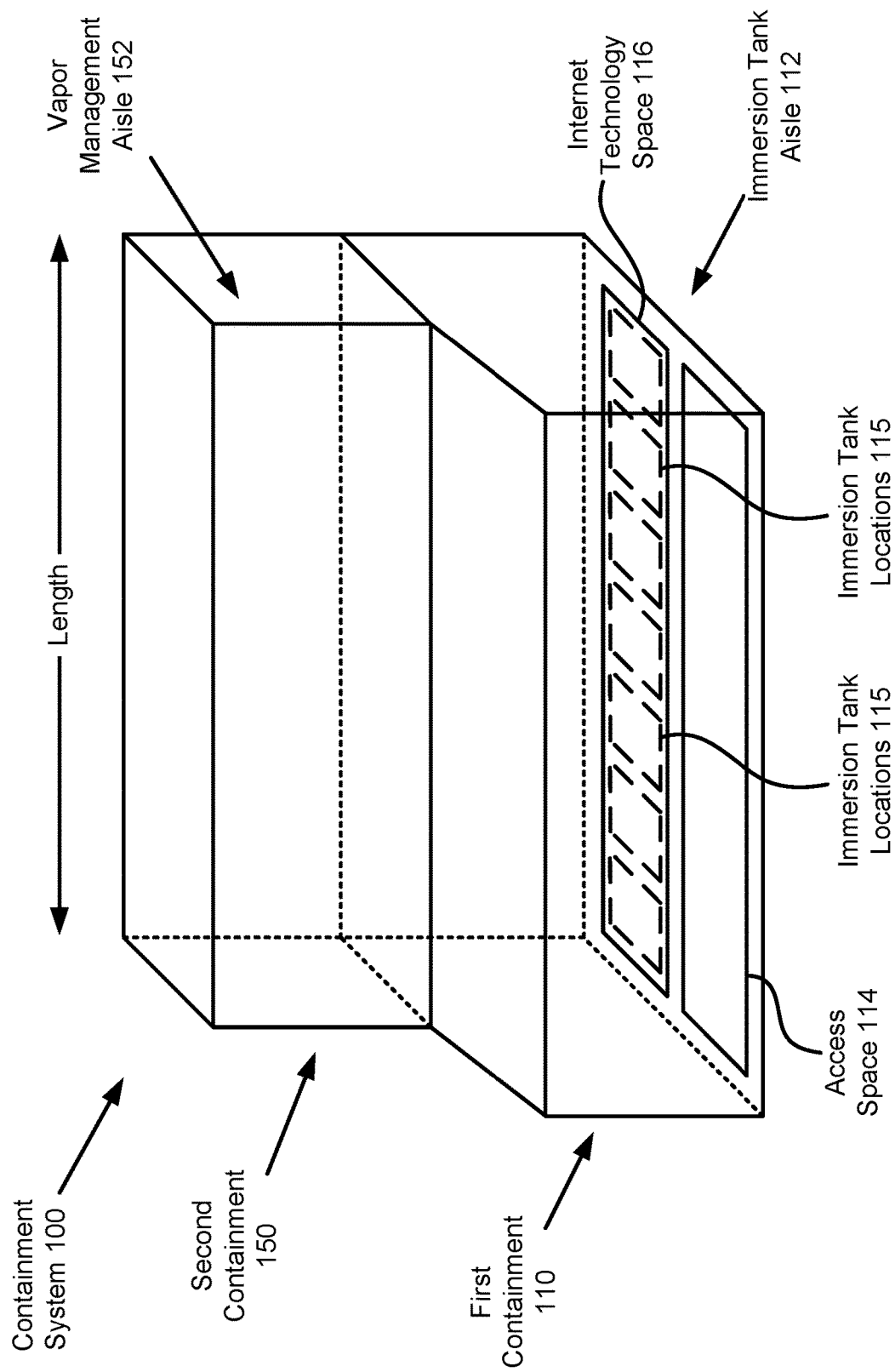
FIG. 1 is a block diagram illustrating a system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein provide methods, systems, and devices for managing coolant in data centers. Coolant may be used in data centers to regulate the temperatures of computing devices. The disclosed methods and system may provide for containment architectures which enable management of vapor and condensation of the vapor into coolant. The coolant may be used as part of a two phase cooling system to cool the computing devices. The vapor may be generated when the coolant removes heat from computing devices during operation while at least partially submerged in the coolant.

To contain the vapor, in an embodiment, a data center design with an aisle layout is disclosed. The aisle layout may provide for containment of vapor within some of the aisles in the aisle layout. For example, the aisle layout may include immersion tank aisles in which immersion tanks that house the computing device partially submerged in coolant are positioned. Other aisle may not provide for containment of the vapor, but the vapor may be isolated from the other aisles thereby preventing (or reducing) the loss of the vapor to an ambient environment through these other aisles.

To condense the vapor into the coolant, the aisle layout may include vapor management aisles positioned with the immersion tank aisles. Vapor return units may be positioned in the vapor management aisles. The vapor return units may condense the vapor into coolant and provide the coolant to a distribution system for distribution to the immersion tanks.

In one embodiment, a containment system for operating a two phase immersion cooling system with a coolant to cool computing devices positioned in immersion tanks is provided. The containment system may include a first immersion tank aisle and a vapor management aisle. The first immersion tank aisle may include an information technology (IT) space for storing the immersion tanks, and an access space that runs along a length of the first immersion tank aisle and from which each of the immersion tanks in the IT space can be physically accessed. The vapor management aisle may be positioned above the first immersion tank aisle to receive vapor that rises from the first immersion tank aisle. The vapor management aisle may include a vapor return unit configured to condense a portion of the vapor that is proximate to the vapor return unit into the coolant. The vapor management aisle may also include a motion system positioned with the vapor return unit. The motion system may be configured to move the vapor return unit along a length of the vapor management aisle.

The containment system may also include a service aisle positioned next to the first immersion tank aisle. The containment system may also include a rear side service entrance through which the immersion tanks are moved into the IT space. The rear side service entrance may be positioned between the first immersion tank aisle and the service aisle.

The containment system may also include a distribution system positioned with the service aisle, the distribution system may be configured to obtain the coolant from the vapor return unit and distribute the coolant to the immersion tanks.

The distribution system may also be configured to distribute a cooling fluid to a condenser positioned in one of the immersion tanks. The condenser may be configured to condense a portion of the vapor in one of the immersion tanks into the coolant.

The coolant may be distributed to device spaces of the immersion tanks to submerge, at least in part, and the computing devices being positioned in the device spaces.

The containment system may also include a second immersion tank aisle substantially similar to the first immersion tank aisle. The second immersion tank aisle and the first immersion tank aisle may be positioned on opposite side of the service aisle, and the second immersion tank aisle may be positioned and oriented to mirror the first immersion tank aisle across the service aisle.

The vapor management aisle may also be positioned above the second immersion tank aisle to receive the vapor from the first immersion tank aisle and the second immersion tank aisle. For example, the vapor management aisle may service multiple immersion tank aisles.

The containment system may also include another vapor management aisle. The other vapor management aisle may be positioned above the second immersion tank aisle to receive a portion of the vapor that rises from a portion of the immersion tanks positioned in the second immersion tank aisle. The vapor management aisle and the other vapor management aisle may both be in fluid communication with a distribution system to distribute the coolant from the both vapor management aisles to the portion of the immersion tanks positioned in the second immersion tank aisle and another portion of the immersion tanks positioned in the first immersion tank aisle.

The motion system may be configured to move the vapor return unit along the length of the vapor management aisle by sequentially moving the vapor return unit to predetermined locations along the length, pausing for durations of time corresponding to the predetermined locations, and then continuing the moving of the vapor return unit after each pausing.

At least a portion of the predetermined locations may correspond to immersion tank locations in the IT space for the immersion tanks.

The vapor return unit may have a length that is a fraction of a length of the vapor management aisle and is unable to condense all of the vapor in the vapor management aisle while positioned at any single location along the length of the vapor management aisle.

The containment system may also include an opening between the first immersion tank aisle and the vapor management aisle, the opening may be positioned to direct different rising portions of the vapor to different locations along the length of the vapor management aisle.

The first immersion tank aisle, a second immersion tank aisle substantially similar to the first immersion tank aisle, and a service aisle positioned between the first immersion tank aisle and the second immersion tank aisle may be implemented as a first module. The vapor management aisle may be implemented as a second module. The first module and the second module may be complementary to each other to assemble the containment system into an operational configuration by positioning and orienting the second module with respect to the first module.

While the containment system is operating, the vapor is formed, in part, when the coolant undergoes a liquid to gas phase change with heat from the computing devices.

The containment system may house a data center, or components thereof. The data center may be cooled with a two phase cooling system. The containment system may provide for containment of vapor and coolant used therein.

The containment system may be modularized. In one embodiment, a modularized containment system for operating a two phase immersion cooling system with a coolant to cool computing devices positioned in immersion tanks is provided. The containment system may include a first module and a second module. The first module may include a first immersion tank aisle. The first immersion tank aisle may include an IT space for storing the immersion tanks, and an access space that runs along a length of the first immersion tank aisle and from which each of the immersion tanks in the IT space can be physically accessed. The first module may also include a second immersion tank aisle substantially similar to the first immersion tank aisle. The first module may also include a service aisle positioned between the first immersion tank aisle and the second immersion tank aisle. The first module may also include first openings positioned with the first immersion tank aisle and the second immersion tank aisle. The second module may include a vapor management aisle positioned to receive vapor that rises from the first immersion tank aisle and/or the second immersion tank aisle. The vapor management aisle may include a vapor return unit configured to condense a portion of the vapor that is proximate to the vapor return unit into the coolant, and a motion system positioned with the vapor return unit, the motion system configured to move the vapor return unit along a length of the vapor management aisle. The second module may also include second openings complementary to the first openings to direct the vapor rising through the first openings and the second openings while the first module and second module are positioned to operate a containment system.

The motion system may be configured to move the vapor return unit along the length of the vapor management aisle by sequentially moving the vapor return unit to predetermined locations along the length, pausing for durations of time corresponding to the predetermined locations, and then continuing the moving of the vapor return unit after each pausing. At least a portion of the predetermined locations correspond to immersion tank locations in the IT space for the immersion tanks.

By implementing a system as discussed herein, (i) a highly efficient phase change fluid management and system operation may be obtained, (ii) coolant loss may be reduced and coolant use efficiency may be improved, (iii) energy efficiency may be improved, (iv) a high efficiency of system operation may be obtained during service mode, and reduce dependency on the IT design, (v) system cost may be reduced, including the capital expenditure and operating expenditure, (vi) system expansibility may be improved, (vii) different immersion systems and architectures may be utilized, (viii) environmental impact on may be reduced, (ix)

modular design for different scales may be obtained, and/or (x) deployment times may be reduced with modularized systems.

FIG. 1 is a diagram illustrating a containment system 100 in accordance with one or more embodiments. In FIG. 1, some features that would otherwise be obscured from view based on the observation location are drawn with short dashed lines to illustrate various features. Containment system 100 may (i) house immersion tanks for cooling devices, (ii) contain vapor from the immersion tanks within various containments, (iii) direct the contained vapor within the containments, (iv) condense the directed vapor into coolant, and (v) distribute the coolant to immersion tanks. To do so, the containment system 100 may include an immersion tank aisle 112 and a vapor management aisle 152. Each of these components are discussed below.

The immersion tank aisle 112 may provide for housing of any number of immersion tanks. Immersion tanks may include physical structures for immersing devices in a coolant for cooling purposes. When the devices immersed in the coolant operate, portions of the coolant may evaporate to cool the devices. The evaporate may rise into an interior of the immersion tank aisle 112 thereby reducing an amount of coolant in the immersion tanks. Coolant may be distributed to the immersion tanks to maintain a level of coolant in the immersion tanks to submerge (partially or completely) one or more devices in the immersion tanks. The devices may include any number of type of devices such as, for example, server boards (e.g., printed circuit cards with components positioned on them), discrete components such as graphics processing units and memory modules, and/or other types of devices that may generate heat when providing their functionality. Any number of such components in the immersion tanks may operate independently (e.g., a separate computing devices) or cooperatively (e.g., separate computing devices cooperating to provide aggregate functionality).

The immersion tank aisle 112 may be implemented with a room, walls, ceiling, floor, and/or other structural components that delineate boundaries of the immersion tank aisle 112. These boundaries may form a first containment 110 that substantially contains vapor within the immersion tank aisle 112 (however some intentional openings in the boundaries may provide for flow of vapor outside of first containment 110, discussed below). For example, the boundaries of the immersion tank aisle 112 that are to contain the vapor may generally be sealed against vapor flow through and/or around the boundaries. By doing so, vapor loss to an ambient environment may be reduced when compared to other structures in which immersion tanks may be positioned that may risk loss of the vapor to the ambient environment. By reducing vapor loss, the rate at which coolant of the containment system 100 may need to be replenished may be reduced thereby reducing the operating cost of the containment system 100, reducing environment pollution by the coolant, and reducing personnel exposure to coolant (in liquid and/or vapor phase). One of ordinary skill in the art will recognize that some vapor may still escape from a containment due to imperfect sealing, but will appreciate that an immersion tank aisle adapted to contain vapor may greatly reduce the rate of vapor flow from the immersion tank aisle. For additional details regarding immersion tanks, refer to FIGS. 2A-2C.

To provide for the containment of vapor, the walls, ceiling, floor, and/or other structures defining boundaries of the immersion tank aisle 112 may include a limited number of openings; may use grommets or other sealing structures with utilities (e.g., pipes, wires, ducting, outlets, etc.) or other structures that may protrude through the boundaries of the immersion tank aisle 112; may be formed from certain types of structures (e.g., panels with sealing coatings, sheeting so as to form a substantially continuous bubble around the immersion tank aisle); may include sprayed layers and/or other materials for sealing various surfaces, corners, etc.; and/or other features. These features may independent and/or in conjunction with one another reduce the rate of vapor flow through the boundaries of the immersion tank aisle 112.

Figure 3A:
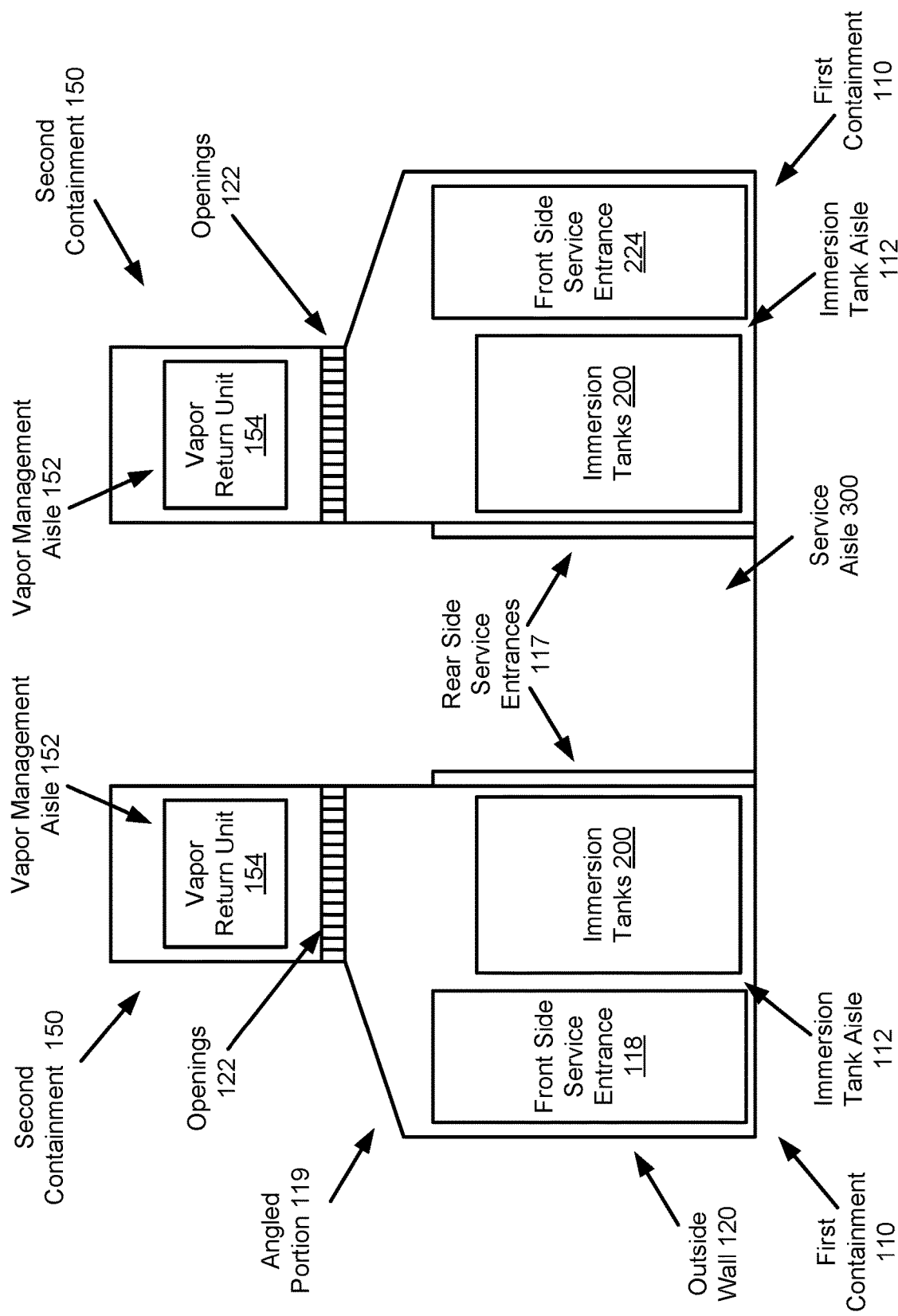
FIG. 3A is a first end view diagram illustrating a containment system according to one embodiment.

In one embodiment, the immersion tank aisle 112 includes a substantially continuous cross section along its length. The immersion tank aisle 112 may have a generally rectangular box shape. However, various portions of the immersion tank aisle 112 may include more complicated faces that facilitate directing of vapor. Refer to FIG. 3A for additional details regarding vapor direction with various features of immersion tank aisle 112.

The immersion tank aisle 112 may include an internet technology space 116 and an access space 114. Each of these spaces may be portions of the immersion tank aisle 112.

The internet technology space 116 may be a portion of the immersion tank aisle 112 in which immersion tanks may be positioned. For example, any number of immersion tank locations 115 may be positioned in the internet technology space 116 along a length of the immersion tank aisle 112. Immersion tanks may be populated to these immersion tank locations 115 and facilitate cooling of devices positioned within the immersion tanks.

The access space 114 may also include a portion of the immersion tank aisle 112 for accessing the immersion tanks positioned in the internet technology space 116. The access space 114 may generally provide for front side access to components positioned in the immersion tanks and the immersion tanks themselves. For example, a person may move along the access space 114 to access one of the immersion tanks in the internet technology space 116. While not illustrated in FIG. 1, doors or other structures through walls that bound the immersion tank aisle 112 may allow a person to move from outside of the immersion tank aisle 112 into the access space 114 within the immersion tank aisle 112. Refer to FIG. 3A for additional details regarding entrances into the immersion tank aisle 112 through various types of entrances. Additionally, while these spaces and locations are illustrated in FIG. 1 with an example layout, these spaces and locations may be arranged with different layouts without departing from embodiments disclosed herein.

In one embodiment, racks or other chassis management structures in which server chassis are positioned in the immersion tanks. The racks and server chassis may be positioned in the immersion tanks to facilitate front side access to the server chassis from the access space 114.

The vapor management aisle 152 may be implemented with a room, walls, ceiling, floor, and/or other structural components that delineate boundaries of the vapor management aisle 152. These boundaries may form a first containment 110 that substantially contains vapor within the vapor management aisle 152.

For example, the boundaries of the vapor management aisle 152 that are to contain the vapor may generally be sealed against vapor flow through and/or around the boundaries. By doing so, vapor loss to an ambient environment may be reduced when compared to other structures in which immersion tanks may be positioned that may risk loss of the vapor to the ambient environment. By reducing vapor loss, the rate at which coolant of the containment system 100 may need to be replenished may be reduced thereby reducing the operating cost of the containment system 100, reducing environment pollution by the coolant, and reducing personnel exposure to coolant (in liquid and/or vapor phase).

In one embodiment, the vapor management aisle 152 includes openings (not shown) to receive vapor from the immersion tank aisle 112. The openings (not shown) of the vapor management aisle 152 may be complementary to similar openings (not shown) on immersion tank aisle 112. For additional details regarding the openings of the immersion tank aisle 112 and the vapor management aisle 152, refer to FIGS. 3A-3D.

In one embodiment, the containment system 100 is adapted to be (or is) positioned above immersion tank aisle 112. When so positioned, vapor in the immersion tank aisle 112 may rise out of openings in the immersion tank aisle 112, through openings in the vapor management aisles 152, and into the interior of the vapor management aisles 152. A vapor return unit (not shown) may be positioned in the interior of the vapor management aisles 152. The vapor return unit may be adapted to condense the vapor into liquid coolant and provide the liquid coolant to a distribution system (not shown) which, in turn, may distribute the coolant to immersion tanks. Refer to FIGS. 3A-3D for additional details regarding the vapor return unit and distribution system.

The immersion tanks, vapor return unit, and distribution system may be part of a two phase immersion system. The two phase immersion system may provide for cooling of devices positioned in the immersion tanks. Vaporization of coolant in the immersion tanks may remove heat from devices submerged in the coolant thereby cooling the devices. In some cases, the vaporized coolant flow out of the immersion tanks into to immersion tank aisle 112 as a vapor. The vapor may rise into the vapor management aisle 152 in which the vapor return unit is positioned. The vapor return unit may condense the vapor into the coolant and return the coolant to the distribution system. The distribution system may use the returned coolant to maintain coolant levels in the immersion tanks.

While illustrated in FIG. 1 as included a limited number of specific components, a containment system in accordance with one or more embodiments may include fewer, additional, and/or different components.

Turning to FIGS. 2A-2D, diagrams of immersion tanks are illustrated. As discussed above, the immersion tanks may provide for cooling of devices. The immersion tanks may be part of a two phase cooling system.

Figure 2A:
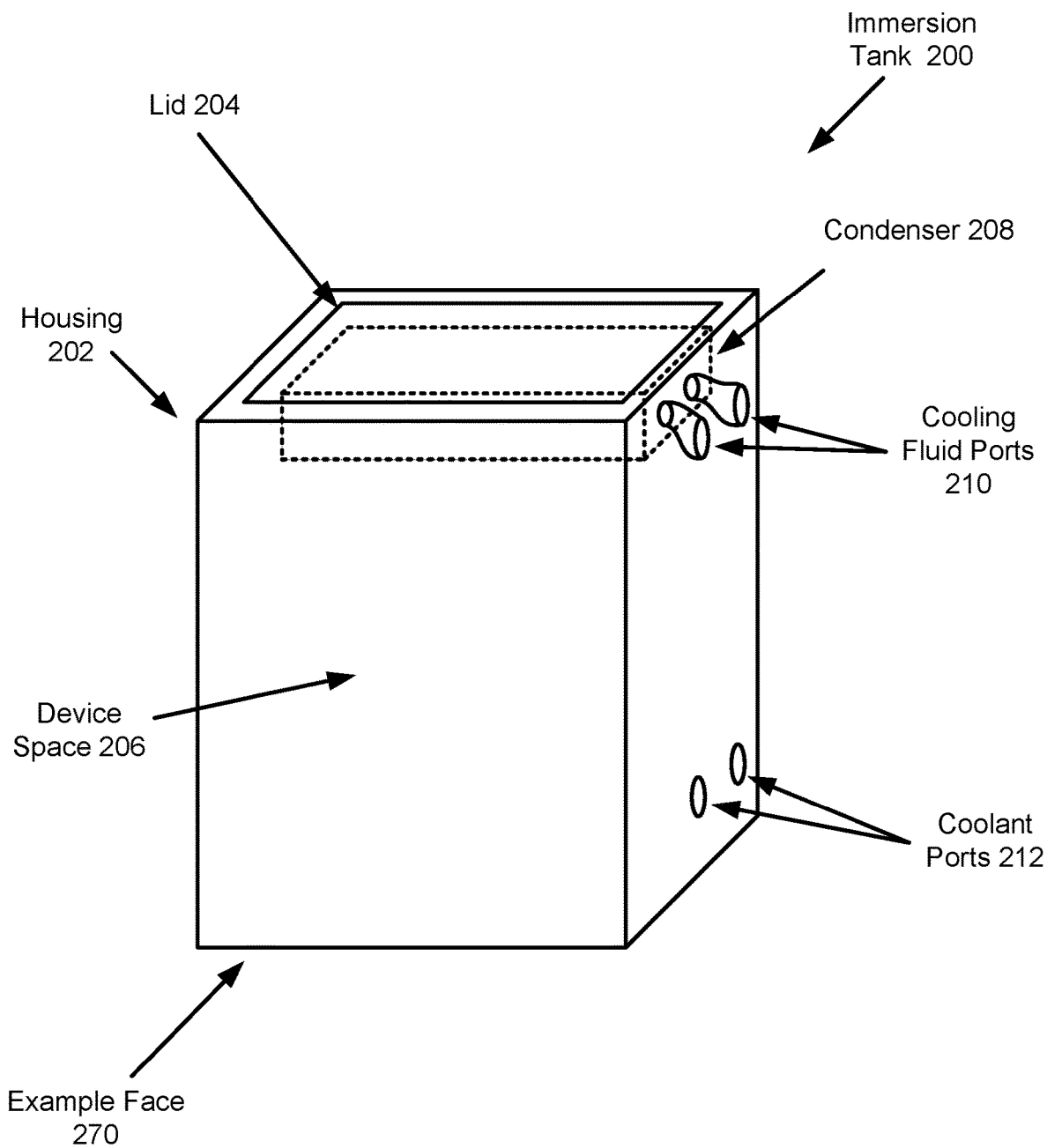
FIG. 2A is a diagram illustrating an immersion tank according to one embodiment.

FIG. 2A is a diagram illustrating immersion tank 200 in accordance with one embodiment. Immersion tank 200 may include housing 202 which delineates an interior region in which device space 206 and condenser 208 (drawn in FIG. 2A in dashing to indicate that it is disposed within housing 202) are positioned. In an embodiment, condenser 208 is not present in immersion tank 200.

Devices may be placed in device space 206 and may be immersed in coolant for thermal management purposes. Generally, if present, condenser 208 may be positioned towards an upper portion of the interior region (e.g., above device space 206) so that vapor (e.g., including vaporized coolant) in device space 206 is naturally directed toward condenser 208 via convection.

Lid 204 may be disposed on a side of housing 202 to allow for devices to be moved into and out of the interior of housing 202. Generally, housing 202 may be sealed (may not be perfectly sealed, some vapor may still escape while lid 204 is closed) while lid 204 is closed and unsealed while lid 204 is open. When unsealed, vapor may escape into an ambient environment via lid 204. When positioned in an immersion tank aisle, the escaped vapor may be contained.

In FIG. 2A, lid 204 is shown in the closed position. Once the lid is open for server operation or other purposes, only a portion of the vapor may be condensed by condenser 208. A majority (or other quantity) of the vapor may escape from immersion tank 200. In one embodiment, the immersion tank 200 and a system of which it is a part generally operates over the long term with lid 204 being open thereby generally allowing vapor to flow out of immersion tank 200. Lid 204 may generally be closed during operation of a system without departing from embodiments disclosed herein.

Coolant ports 212 may be disposed on housing 202. Coolant ports 212 may allow coolant to be added to and removed from the interior of housing 202 without allowing coolant and/or vapor from escaping through coolant ports 212. While illustrated as being on a side, coolant ports 212 may be located in other locations without departing from embodiments disclosed herein. For example, a first (e.g., a fill port) of the coolant ports may be disposed on a top of housing 202 while a second (e.g., a dump port out of which coolant is removed) of the coolant ports may be disposed on a lower portion of housing 202.

In one embodiment, cooling fluid ports 210 may be positioned on housing 202. Cooling fluid ports 210 may allow cooling fluid to be added to, removed from, and/or circulated through condenser 208 without allowing coolant and/or vapor from escaping through cooling fluid ports 210. Like coolant ports 212, cooling fluid ports 210 may be positioned at other locations without departing from embodiments disclosed herein. In one embodiment, immersion tank 200 does not include cooling fluid ports 210 (e.g., when immersion tank 200 does not include condenser 208).

Housing 202 may generally have a shape such as a rectangular box, cylindrical tube, or other shape that allows for Immersion tank 200 to provide its functionality. The shape may include any number of faces including example face 270. In the view shown in FIG. 2A, the example face 270 may be a right hand side of the immersion tank 200, and the fluid ports may be positioned at the rear side of the immersion tank 200. Housing 202 and the other components of immersion tank 200 may be formed from any number of materials such as, for example, metals, plastics, rubbers, and/or other materials that enable immersion tank 200 to provide its functionality.

While illustrated in FIG. 2A as included a limited number of specific components, an immersion tank in accordance with one or more embodiments may include fewer, additional, and/or different components.

Figure 2B:
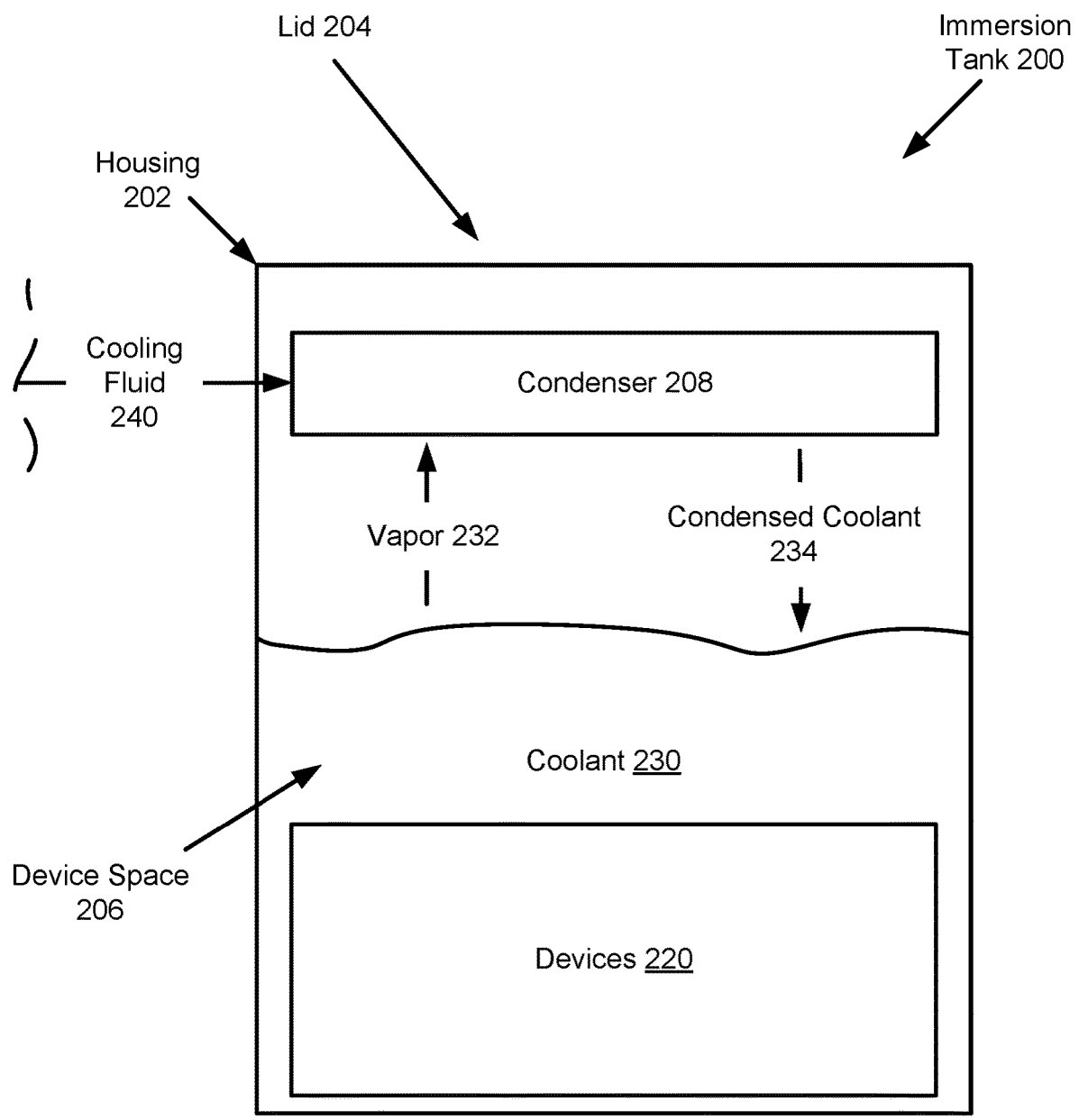
FIG. 2B is a first section diagram illustrating the immersion tank according to one embodiment.

Turning to FIG. 2B, a first section diagram of Immersion tank in a sealed configuration in accordance with one embodiment looking toward example face 270 is shown. As seen in FIG. 2B, lid 204 is in the closed positioned. While lid 204 is closed, thermal loads from devices 220 immersed in coolant 230 may be transferred (e.g., via conduction, convection, etc.) to coolant 230 thereby maintaining the thermal states of the devices 220 while the devices 220 operate (e.g., perform functions that generate heat as a byproduct or direct result of the performed functions).

A portion of coolant 230 may vaporize due to the transferred thermal loads resulting in the generation of vapor 232. Because immersion tank 200 is in a sealed configuration, vapor 232 may be trapped within immersion tank 200. Condenser 208 may process vapor 232 to obtain condensed coolant 234 (e.g., liquid coolant), which may be returned to coolant 230 in the housing 202.

Condenser 208 may condense vapor 232 using cooling fluid 240 (circulated through it) by transferring the thermal loads from vapor 232 into cooling fluid 240. By virtue of the circulation of cooling fluid 240 within condenser 208, the thermal loads transferred into cooling fluid 240 may be transferred out of immersion tank 200 thereby thermally managing the components disposed in immersion tank 200 by cooling them, including any devices immersed in coolant 230.

Figure 2C:
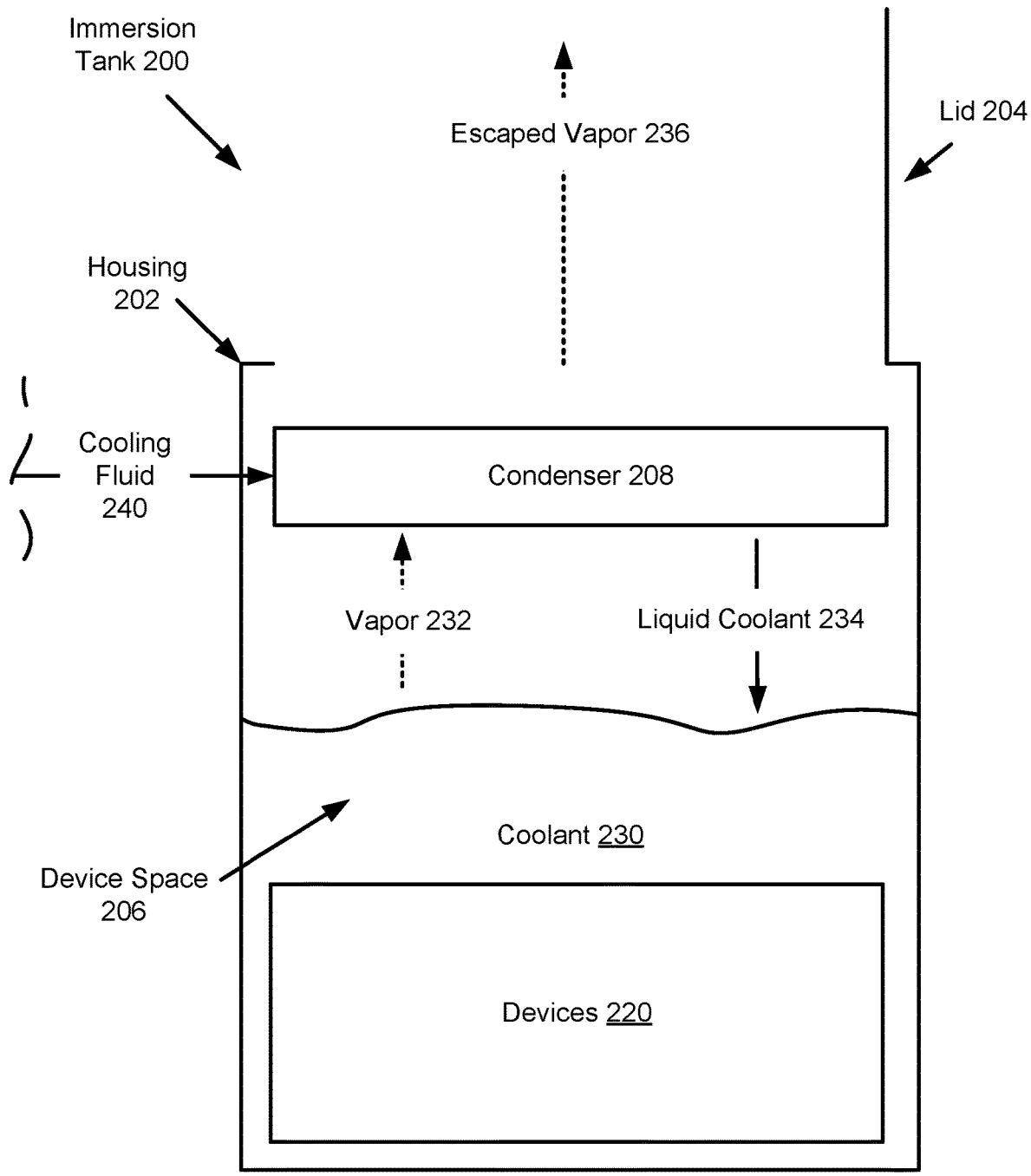
FIG. 2C is a second section diagram illustrating the immersion tank according to one embodiment.

Turning to FIG. 2C, a second section diagram of immersion tank 200 is shown in an unsealed configuration in accordance with one embodiment looking toward example face 270 of FIG. 2A. As seen in FIG. 2C, lid 204 is in an open position. Lid 204 may be opened to, for example, enable physical access one or more devices positioned in the interior of housing 202. For example, if a device that is being thermally managed begins to malfunction, needs to be upgraded (e.g., add/remove hardware), or needs to be physically accessed for other reasons, lid 204 may need to be opened to enable physical access to the device. In some embodiments, lid 204 may generally remain open during operation of a system thereby allowing vapor 232 to rise out of immersion tank 200. In some embodiments, lid 204 may generally remain open during periods of time during which cooling fluid 240 is unavailable for circulation through condenser 208 or condenser 208 is inoperable for other reasons.

While lid 204 is open, thermal loads from devices (not shown) immersed in coolant 230 may be transferred (e.g., via conduction, convection, etc.) to coolant 230 thereby maintaining the thermal states of the devices while the devices operate (e.g., perform functions that generate heat as a byproduct or direct result of the performed functions).

A portion of coolant 230 may vaporize (or is already vaporized by virtue of previous operation of devices disposed in Immersion tank 200) due to the transferred thermal loads resulting in the generation and/or presence of vapor 232. Because immersion tank 200 is in the unsealed configuration (or even while sealed but at a lesser rate), at least a portion of vapor 232 may escape out of immersion tank 200 as escaped vapor 236 (even while condenser 208 operates, condenser 208 may not operate and/or be present in all embodiments disclosed herein). While lid 204 is open, vapor may continue to be generated and/or escape from lid 204.

As will be discussed in greater detail below, escaped vapor 236 may be contained with various aisle and condensed back into coolant for distribution to immersion tanks.

Figure 2D:
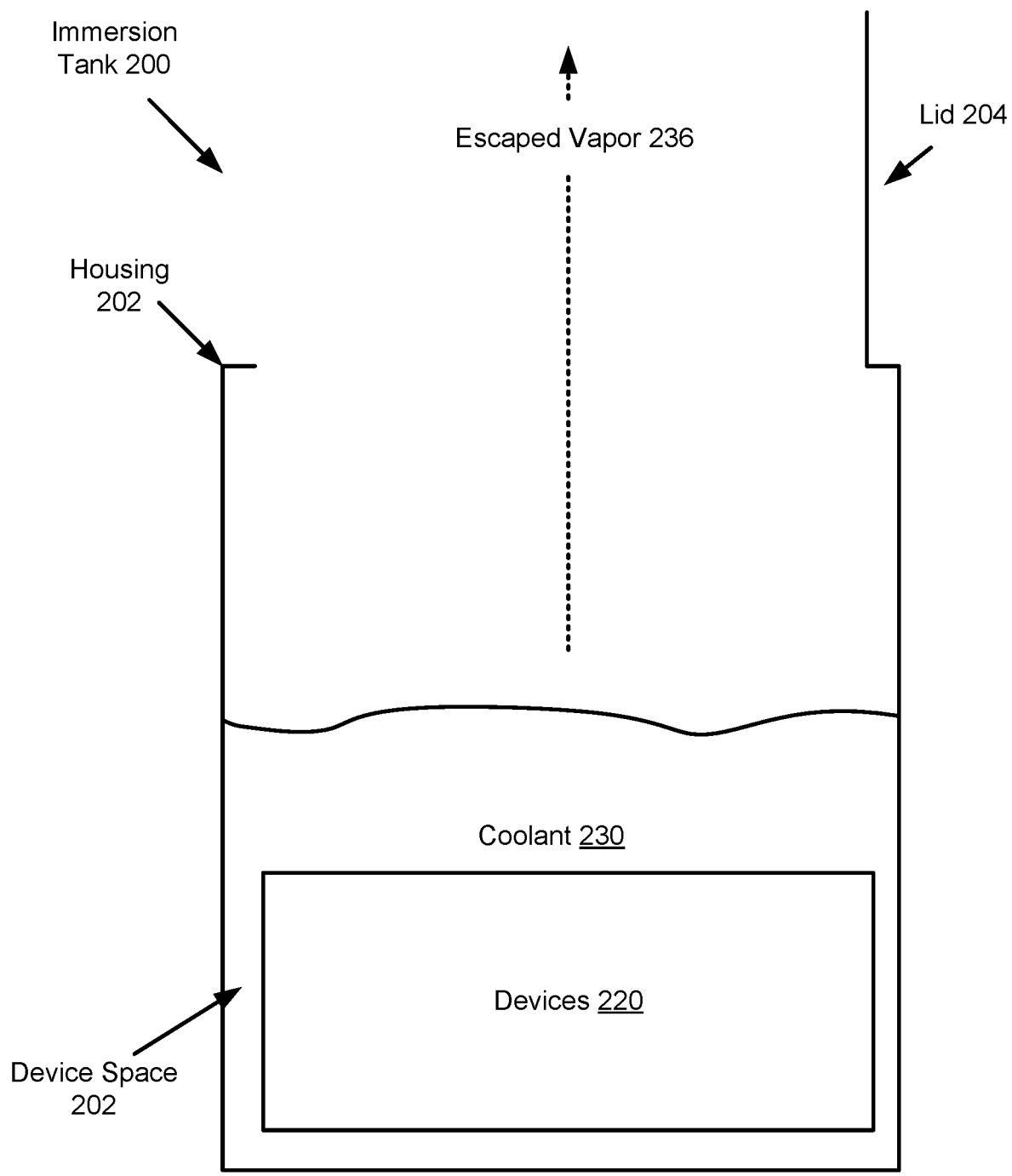
FIG. 2D is a third section diagram illustrating an immersion tank according to one embodiment.

Turning to FIG. 2D, a third section diagram of immersion tank 200 is shown in an unsealed configuration in accordance with one embodiment looking toward example face 270 of FIG. 2A. As seen in FIG. 2D, in an embodiment, immersion tank 200 does not include a condenser or cooling fluid ports (but may include coolant ports, not shown, to allow coolant 230 to be added/removed). Lid 204 may generally be maintained as opened (while the system is operating) allowing for vapor to rise out of immersion tank 200 as escaped vapor 236. Coolant 230 may generally be replenished with liquid coolant from a distribution unit, discussed in greater detail below. Coolant 230 may generally be delivered as necessary (e.g., constantly, intermittently, on-demand, etc.) to the immersion tank 200 to maintain a level of coolant 230 in immersion tank 200. Additionally, coolant 230 may be removed from immersion tank 200 at various points in time and during various periods of time to facilitate removal/addition of devices 220 and/or for other purposes.

Figure 3B:
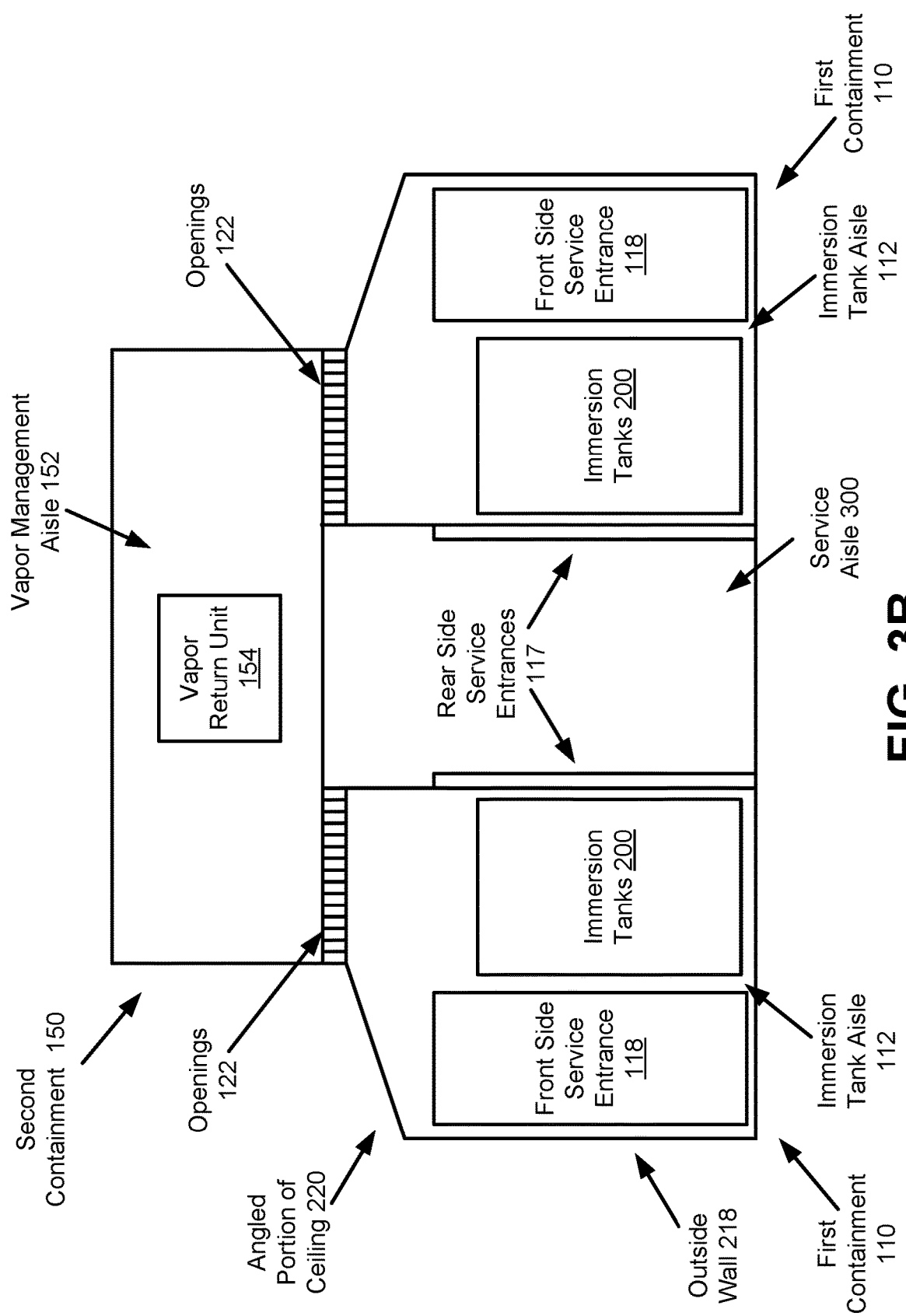
FIG. 3B is a second end view diagram illustrating a containment system according to one embodiment.
Figure 3C:
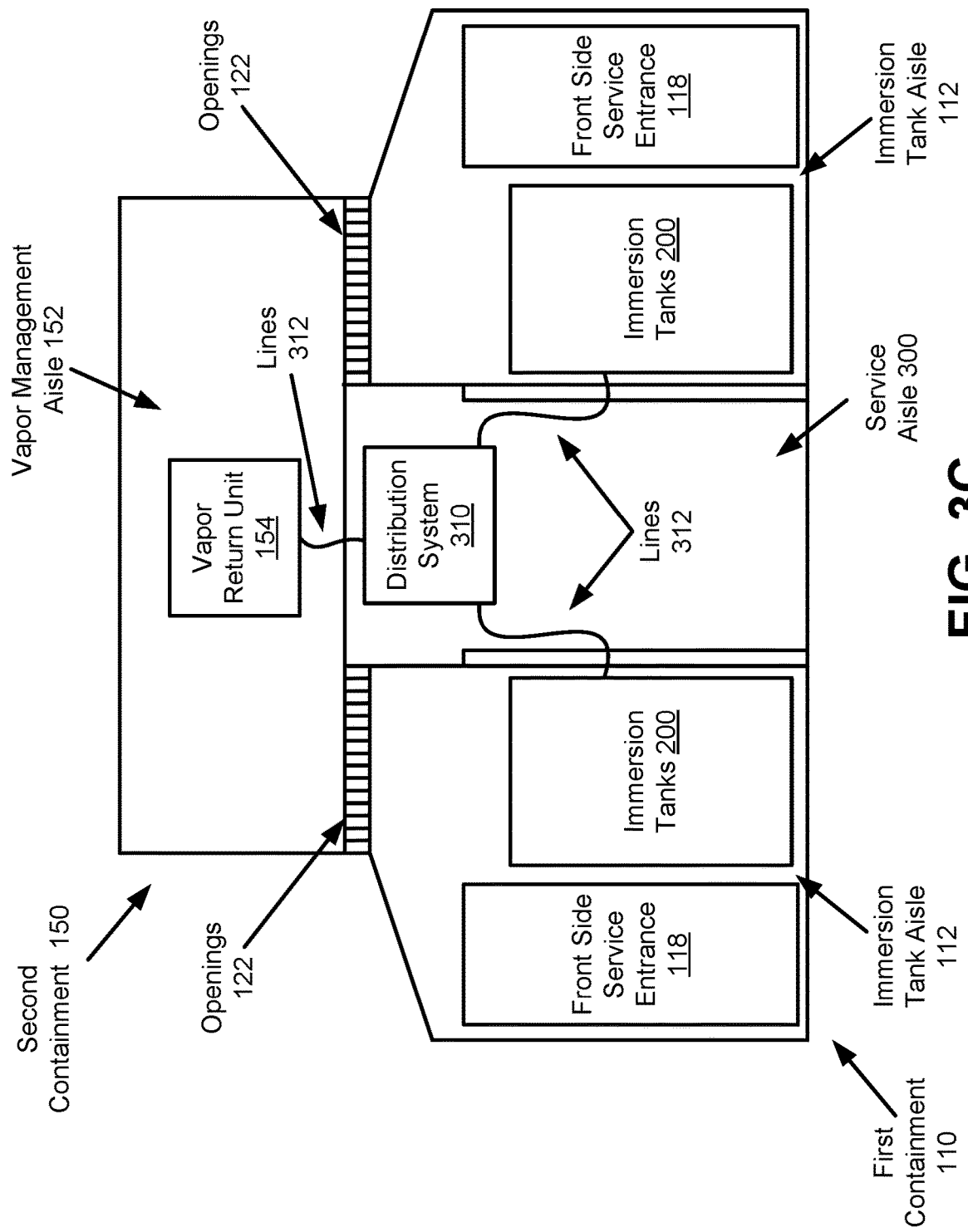
FIG. 3C is a third end view diagram illustrating a containment system according to one embodiment.

Turning to FIG. 3A, a side view diagram of a containment system in accordance with one or more embodiments is shown. The views in FIGS. 3A-3D may from beyond an end of the length shown in FIG. 1 looking toward the end of the length. The containment system may include two immersion tank aisles 112, two vapor management aisles 152, and a service aisle 300. As discussed above, the immersion tank aisles 112 may house any number of immersion tanks 200 and the vapor management aisles 152 may condense vapors into coolant from the immersion tank aisles 112. The components illustrated in FIG. 3A may form a unit of a containment system, and the containment system may include any number of these units. The units may be repeated (e.g., to the left/right in FIG. 3A) to scale the capacity of the containment system. FIGS. 3B-3C may illustrate other types of units of containment systems. A containment system may include any number of such units.

The service aisle 300 may provide for (i) moving immersion tanks into and out of the immersion tank aisles 112, (ii) rear side access of the immersion tanks positioned in the immersion tank aisles 112, and (iii) distribution of coolant to the immersion tanks. The service aisle 300 may be implemented with a room, walls, ceiling, floor, and/or other structural components that delineate boundaries of the service aisle 300. These boundaries may form a containment or may not form a containment. For example, the boundaries of the service aisle 300 may either contain vapor within the boundaries or may not contain vapor within the boundaries. Like the vapor management aisles 152 and immersion tank aisles 112, the service aisle 300 may generally have a rectangular box shape, but may have a more complicated shape without departing from embodiments disclosed herein.

In one embodiment, the service aisle 300 is positioned between a pair of the immersion tank aisles 112. The pair of immersion tank aisles 112 may mirror each other across the service aisle 300.

In one embodiment, the containment system includes rear side service entrances 117. The rear side service entrances 117 may allow for physical access to the interiors of the immersion tank aisles 112 from the service aisle 300. For example, the rear side service entrances 117 may be implemented with doors or other structures that facilitate reversible opening of portions of a boundary of the immersion tank aisles 112 and/or service aisle 300. The rear side service entrances 117 may be positioned between the immersion tank aisles 112 and the service aisle 300. The rear side service entrances 117 may be positioned proximate to the internet technology spaces in the immersion tank aisles 112.

Figure 4A:
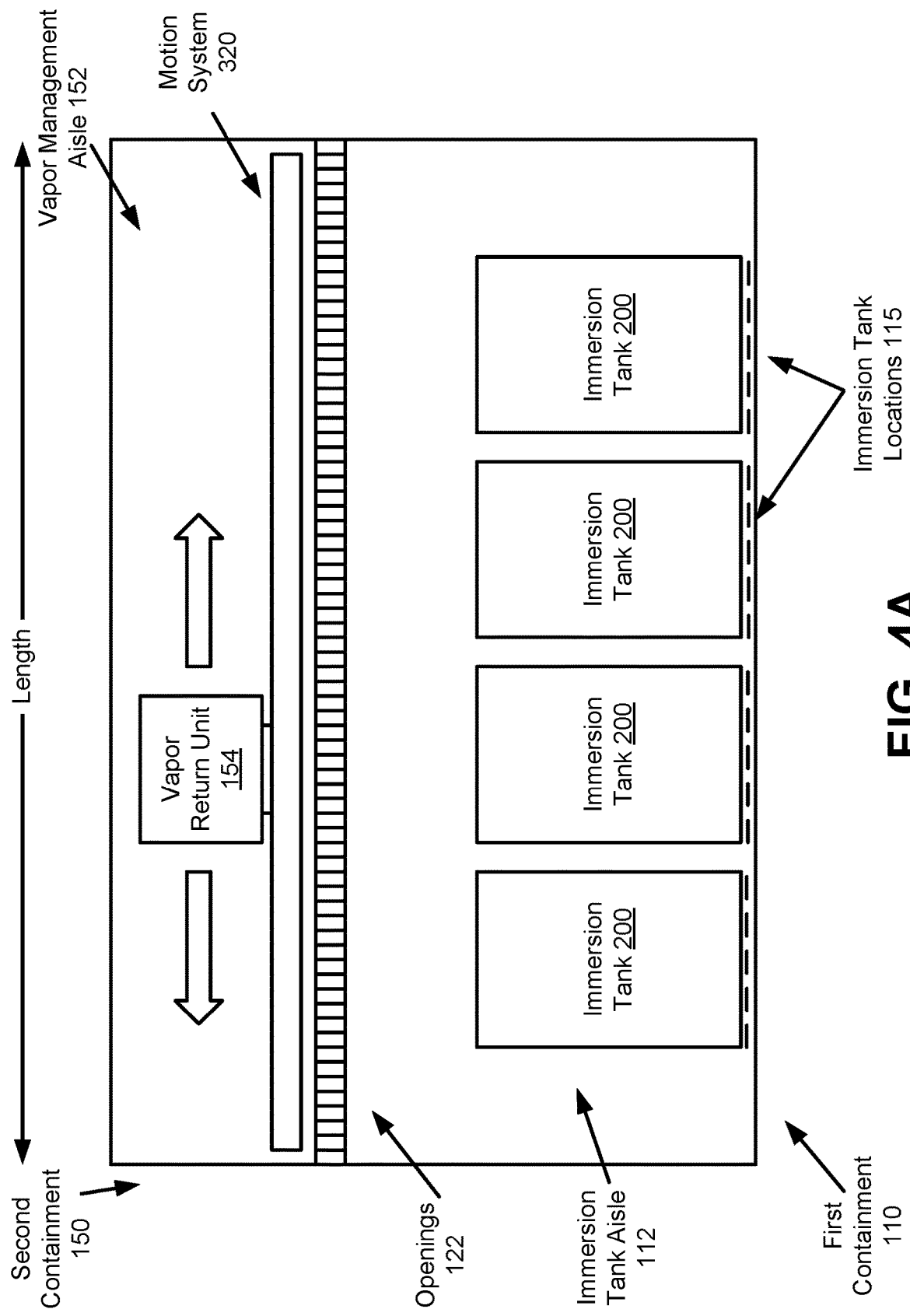
FIG. 4A is a first side view diagram illustrating a containment system according to one embodiment.
Figure 4B:
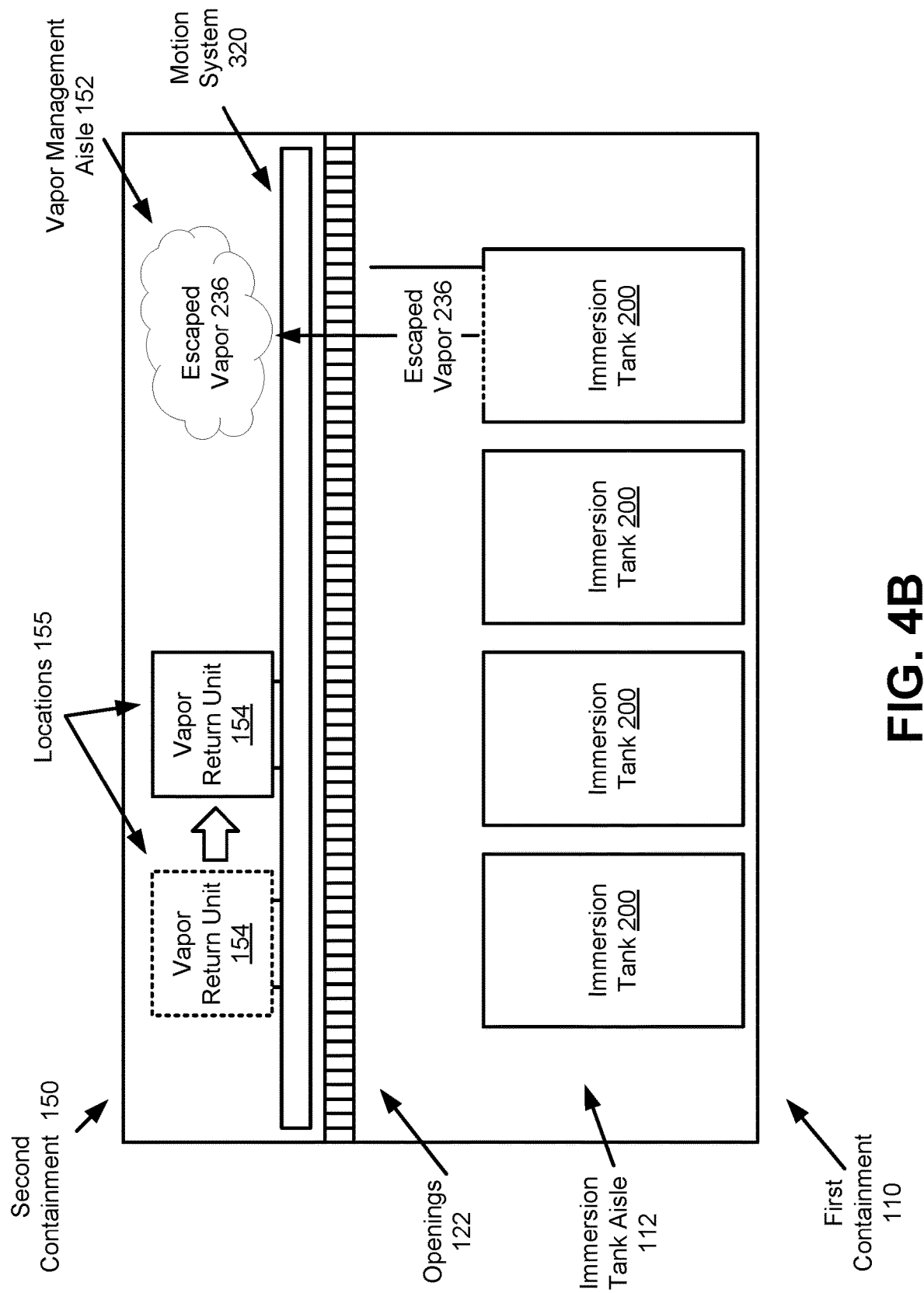
FIG. 4B is a second side view diagram illustrating a containment system according to one embodiment.
Figure 4C:
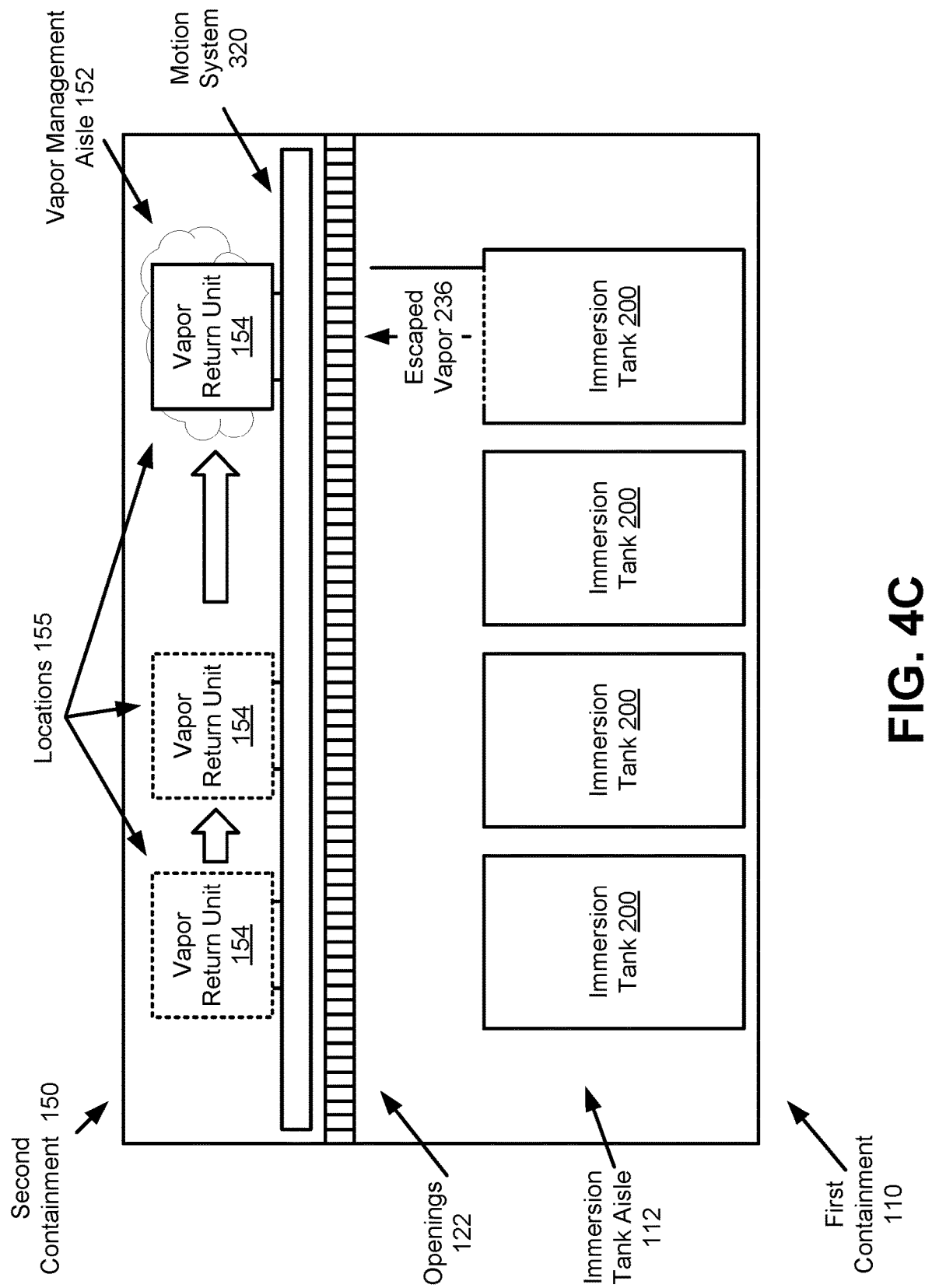
FIG. 4C is a third side view diagram illustrating a containment system according to one embodiment.

The vapor management aisle 152 may be positioned above the immersion tank aisles 112. In one embodiment, the vapor management aisles 152 are positioned above the internet technology spaces in the immersion tank aisles 112. By being positioned above the internet technology spaces, vapor from immersion tanks in the internet technology spaces may naturally rise into the vapor management aisle 152 through outside wall 120. Vapor return units 154 may be positioned in the vapor management aisles 152. In one embodiment, vapor return units 154 are adapted for movement within the vapor management aisles 152 to allow for vapor in different regions of the vapor management aisles 152 to be condensed into coolant. For example, the vapor return units 154 may have shapes, sizes, attachment features, and other characteristics that may be usable to facilitate their movement. Refer to FIGS. 4A-4C for additional details regarding movement of vapor return units.

Figure 3D:
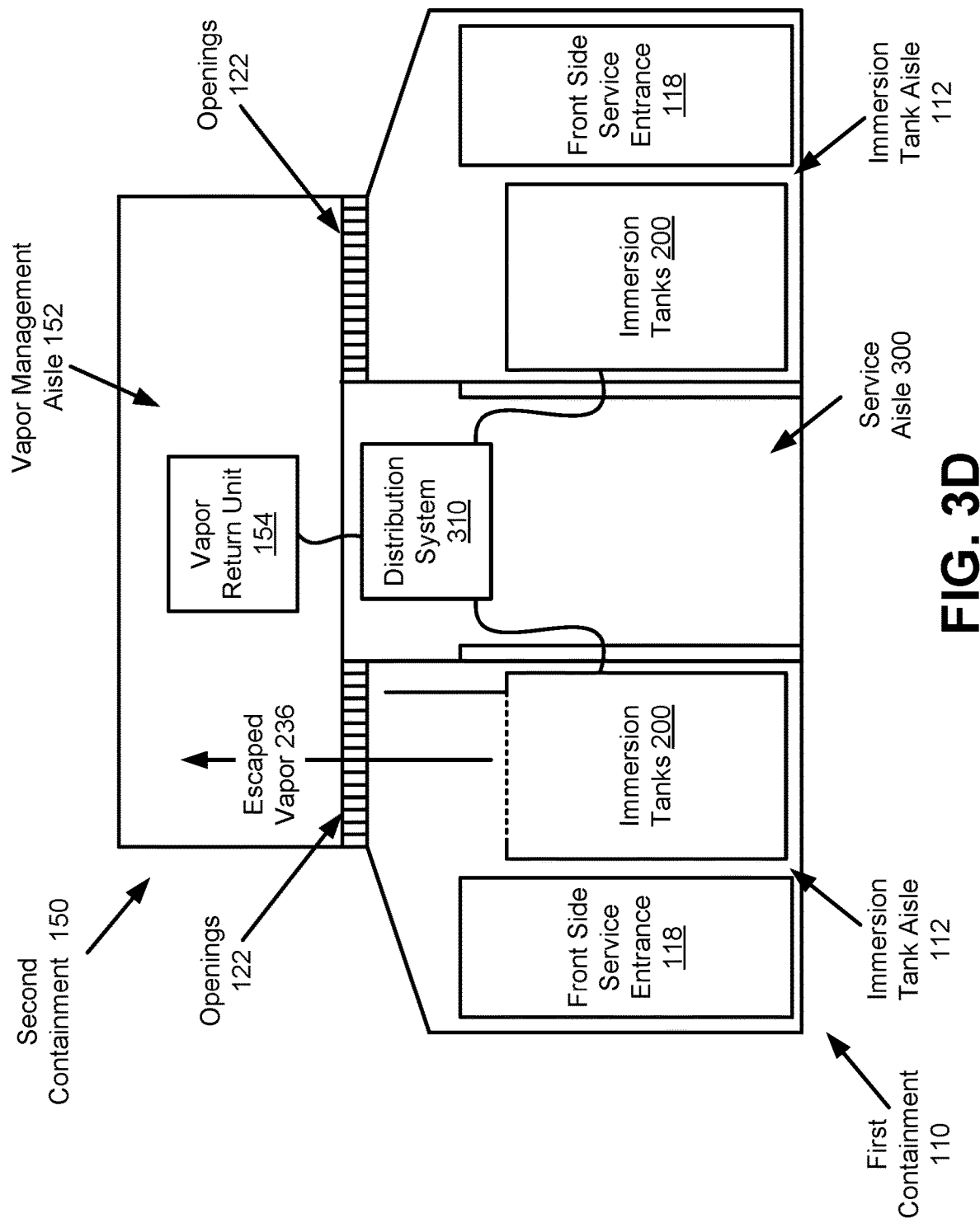
FIG. 3D is a fourth end view diagram illustrating a containment system according to one embodiment.

In one embodiment, vapor return units 154 include condensers. Generally, the vapor return units 154 may convert vapor to liquid coolant and return the liquid coolant to a distribution system that manages distribution of coolant to immersion tanks 200. The condensers may condense vapor proximate to the vapor return units 154 into coolant. The vapor return units 154 may be smaller in size than the vapor management aisles 152 and, consequently, may only be capable of condensing a portion of the vapor in the vapor management aisles 152 when positioned at any single position in the vapor management aisles. The condensed coolant be may be provided to a distribution system. Refer to FIGS. 3C-3D for additional details regarding the distribution system.

In one embodiment, the immersion tank aisles 112 include ceilings that include angled portions 119. The angled portions may direct vapor from access space in the immersion tank aisles 112 toward openings 122 between the immersion tank aisle 112 and the vapor management aisle 152.

In one embodiment, the openings 122 are continuous openings that span a portion of the ceiling of the immersion tank aisles 112 and/or floors of the vapor management aisles 152. In one embodiment, the openings 122 include perforated portions of the ceiling of the immersion tank aisles 112 and/or floors of the vapor management aisles 152. For example, the perforations may allow for vapor to rise from the immersion tank aisles 112 into the vapor management aisle 152.

To facilitate front side access to the immersion tanks, in one embodiment, the containment system includes front side service entrances 118. The front side service entrances 118 may be positioned, for example, at an end of the length of the immersion tank aisles. The front side service entrances 118 may be aligned with the access space in the immersion tank aisles 112. The front side service entrances 118 may be positioned by an outside wall 120 of the immersion tank aisle 112 (e.g., the outside wall may be opposite of the rear side service entrances 117). The front side service entrances 118 may include, for example, doors other structures that facilitate reversible opening of portions of a boundary of the immersion tank aisles 112.

Turning to FIG. 3B, a side view diagram of a containment system in accordance with one or more embodiments is shown. The containment system may include two immersion tank aisles 112, a vapor management aisle 152, and a service aisle 300. The vapor management aisle 152 may provide for vapor management for both of the immersion tank aisles 112.

As seen in FIG. 3B, the vapor management aisle 152 may be positioned above both of the immersion tank aisles 112. The vapor management aisle 152 may also be positioned above the service aisle 300. The vapor return unit 154 of the vapor management aisle 152 may condense vapor from both immersion tank aisles 112 into coolant and provide the coolant to a distribution system. For example, outside wall 120 corresponding to both immersion tank aisles 112 may allow vapor from either immersion tank aisle 112 to rise into the vapor management aisle 152.

While the vapor return unit 154 is illustrated in FIG. 3B with a specific size and shape, the vapor return unit 154 in this figure and in other figures may have other shapes without departing from embodiments disclosed herein. For example, the vapor return unit 154 may have a shape of sufficient size to extend across both immersion tank aisles 112 and the service aisle 300. The length, width, and depth of the vapor return unit 154 may be different from the length, width, and depth of the vapor management aisles 152 such that all of the vapor in the vapor management aisles 152 may not be condensed into coolant if the vapor return unit 154 is not moved between the locations 155.

Turning to FIG. 3C, a side view diagram of a containment system in accordance with one or more embodiments is shown. The containment system may include two immersion tank aisles 112, a vapor management aisle 152, and a service aisle 300, like those shown in FIG. 3C. To distribute coolant, the containment system may include a distribution system 310. The distribution system 310 may distribute coolant to the immersion tanks.

To distribute coolant, the distribution system 310 may include, for example, tanks for storing coolant; manifolds, valves, pumps, and/or other types of fluid flow components; controllers or other devices for managing the operation of the fluid flow components; sensors for determining the operational state of the distribution system; and/or other components that may facilitate distribution of coolant. The distribution system 310 may also include similar components for distribution of cooling fluid used by condensers of the immersion tanks 200 and/or the vapor return unit 154 to condense vapor into coolant.

The distribution system 310 may be connected to the immersion tanks and/or the vapor return unit 154 with any number of lines 312. Lines 312 may form fluid flow channels between these components thereby allowing coolant and/or cooling fluid to flow between these components. In an embodiment, fluid control units such as valves may be positioned with the lines 312 to control the flow of coolant between each immersion tank and the distribution system 310. For example, a valve may be positioned in the fluid flow paths between one or more of the immersion tanks 200 and the distribution system 310 to control the rate (e.g., limit, stop, facilitate, etc.) of coolant flow from the distribution system 310 to one or more of the immersion tanks 200.

In one embodiment, distribution system 310 is positioned in service aisle 300. Distribution system 310 may be positioned at other locations without departing from embodiments disclosed herein. While the distribution system 310 is illustrated in FIG. 3C in conjunction with a specific unit, the distribution system 310 may be used in conjunction with other units (e.g., as illustrated in FIG. 3A) without departing from embodiments disclosed herein.

Turning to FIG. 3D, a side view diagram of a containment system in accordance with one or more embodiments is shown. The containment system may include two immersion tank aisles 112, a vapor management aisle 152, and a service aisle 300, like those shown in FIG. 3D.

With respect to FIG. 3D, consider an example scenario in which immersion tanks 200 are housing computing devices of a data center system that provides desired computer implemented services (e.g., database services, electronic communications services, and/or any other type of service that may be provided with computing devices). While providing the computer implemented services, a component of one of the computing devices may fail thereby impairing the function of the data center system.

To remediate the impaired function of the data center system, a person may enter an immersion tank aisle, in which the failed component is positioned in an immersion tank, through a front side service entrance. In FIG. 3D, consider the failed component to be housed in an immersion tank in the immersion tank aisle illustrated on the left hand side of the page. Once the person is near the immersion tank in which the failed component is positioned, the person may open a lid of the immersion tank to access the failed component for replacement purposes. Opening the lid may, as illustrated on the left in FIG. 3D, result in escaped vapor 236 rising out of the immersion tank 200, through the opening 228, and into the vapor management aisle 152.

Once in the vapor management aisle, escaped vapor 236 may be condensed by vapor return unit 154 into coolant. The coolant may be provided to distribution system 310 with lines 312. The distribution system 310 may distribution the coolant to the immersion tanks 200 as necessary to maintain the level of coolant in the immersion tanks 200.

Turning to FIGS. 4A-4C, each of these figures illustrate a side view diagram of a containment system in accordance with one or more embodiments. The views shown in FIGS. 4A-4C may be looking along a length of the aisles.

As seen in these figures, the immersion tanks 200 may be positioned in the immersion tank aisle 112 at various immersion tank locations 115 (illustrated with dashed lines corresponding to the locations, whereas in FIG. 1 the locations are shown with shapes having dashed outlines) along its length. By virtue of these placements, vapor that rises from any of immersion tanks 200 may flow into corresponding locations in vapor management aisle 152. While the immersion tanks 200 in FIG. 4A are illustrated with example positions, the immersion tanks 200 may be positioned differently within immersion tank aisle 112. For example, the immersion tanks may be positioned close to one another (e.g., removing space between them seen in FIG. 4A) to increase the density of the immersion tanks 200 in the immersion tank aisle 112. Similarly, additional immersion tanks may be present.

Above the immersion tanks 200, vapor return unit 154 may be positioned with a motion system 320. The motion system 320 move the vapor return unit 154 to various locations 155 along the length of the vapor management aisle 152. The locations 155 may correspond to or be based on the locations of the immersion tanks 200 along the length of the immersion tank aisle 112.

For example, as seen in FIG. 4B, when escaped vapor 236 rises from one of the immersion tanks into the vapor management aisle 152, the vapor return unit 154 may be positioned elsewhere in the vapor management aisle 152. Consequently, escaped vapor 236 may not be immediately condensed into coolant when it rises into vapor management aisle 152.

To condense escaped vapor 236 into coolant, vapor return unit 154 may move between the locations 155. For example, in FIG. 4B, a copy of vapor return unit 154 is shown with a dashed outline to indicate a location where vapor return unit 154 was positioned at a previous point in time. In one embodiment, the vapor return unit 154 is sequentially moved between the locations 155 that are nearest to one another. The vapor return unit 154 may pause at the locations 155 for predetermined amounts of time and then may continue the sequential movement after each pause.

In this manner, as seen in FIG. 4C, the vapor return unit 154 may be moved to a location corresponding to the escaped vapor 236 thereby allowing vapor return unit 154 to condense the escaped vapor 236 back into coolant.

In one embodiment, the motion system 320 include a pair of rails (or other structure for controlling a motion path) and a sled (or other structure for moving along a motion path). The sled may be coupled to the pair of rails and the vapor return unit 154 may be coupled to the sled. The sled may be coupled to a motor (e.g., an electric motor), actuator, or other device of the motion system 320 that moves the sled to positions corresponding to the locations 155 along the rails. The motor may be operably connected to any type of control system (e.g., discrete circuit, programmable circuit, etc.) that manages the operation of the motor or other device to move the vapor return unit 154 on the sled between the locations 155. The motion system 320 may include sensors or other devices for monitoring the location of the sled, operation of the motor, and/or for collecting other information usable to manage its operation. In one embodiment, the vapor return unit 154 may periodically change the locations with a preset time span.

While not illustrated in these figures, the vapor return unit 154 may be connected to the distribution system with flexible lines to maintain fluid communication between these components while vapor return unit 154 moves between locations 155. Similarly, vapor return unit 154 may be connected to a power source (e.g., electricity usable to drive a compressor or other device for compressing vapor into coolant) with a flexible cable or other power distribution component that is able to supply vapor return unit 154 with power as it moves between locations 155. In an embodiment, the coolant condensed from vapor may be collected with a collector (e.g., a pan or other structure not shown) positioned underneath the motion system 320 or with the motion system (e.g., within, the motion system 320 may include an integrated pan or other type of collection structure such as tubes, reservoirs, etc.). The collector may be in fluid communication with a distribution system via, for example, lines 312 as illustrated in FIG. 3C.

Figure 5:
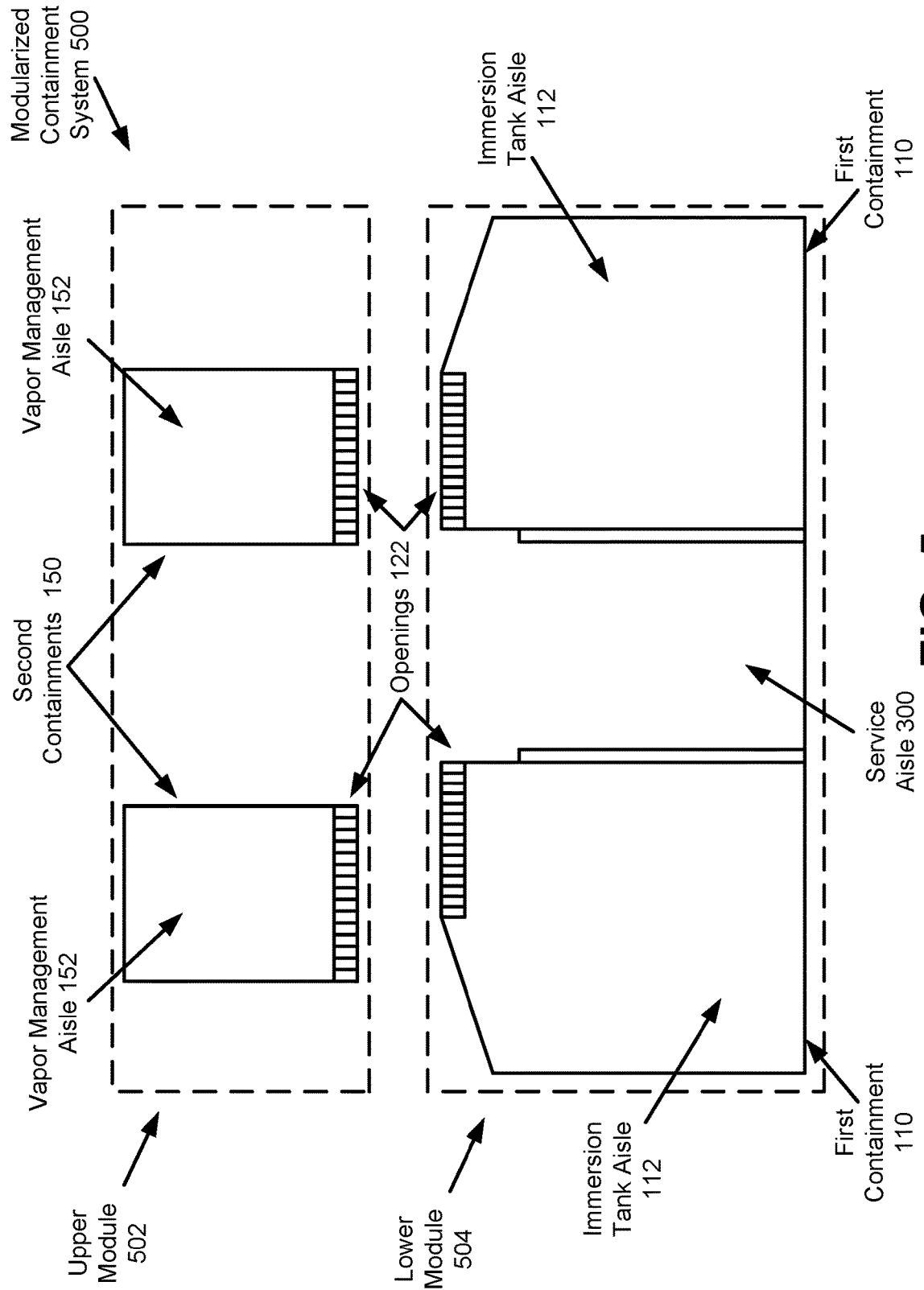
FIG. 5 is an end view diagram illustrating a modularized containment system according to one embodiment.

Turning to FIG. 5, a side view diagram of a modularized containment system in accordance with one or more embodiments is shown. The view point in FIG. 5 may be looking towards an end of a length of the aisles of a containment system, similar to the view point of FIG. 3A.

To facilitate deployment of containment systems, the various portions of the containment system illustrated in FIGS. 1-4C may be formed into modules to obtain a modularized containment system 500. Each of the modules of modularized containment system 500 may include a portion of the components of a containment system. The modules may also be adapted to be attached to one another to form a containment system. For example, the modules may include alignment structures (e.g., pins, holes, and/or other structures) to position and orient the modules with respect to one another. When in the predetermined positions and orientations, various openings, connections, and other features on the modules that are complementary to other features on other modules may be easily coupled to each other to place a containment system into operating condition. Similarly, various seals may be formed to form containments (e.g., first containments 110, second containments 150).

In one embodiment, a first module (e.g., a lower module 504) include two immersion tank aisles 112 and a service aisle 300 positioned between them. The lower module 504 may include outside wall 120 to allow vapor to rise out of the immersion tank aisles 112 into vapor management aisles 152 when the lower module 504 is positioned with an upper module 502.

In one embodiment, a second module (e.g., an upper module 502) includes two vapor management aisles 152 (e.g., corresponding to the immersion tank aisles 112 of the lower module 504). The upper module 502 may include outside wall 120 to allow vapor to rise out of the immersion tank aisles 112 into the vapor management aisles 152 when the lower module 504 is positioned with an upper module 502. The upper module 502 may also include, for example, quick connect connections to allow vapor return units in the vapor management aisles 152 to be placed in fluid connection with a distribution system positioned in the service aisle 300 when the upper module 502 is positioned with the lower module 504.

While illustrated in FIG. 5 with respect to modularization of a unit, multiple units may be similarly modularized (with a lower module 504 including, for example, four immersion tank aisles and two service aisle and an upper module 502 including, for example, four vapor management aisles). To modularize these components, the various components may be integrated into structures (e.g., boxes, shipping containers, etc.). In FIG. 5, example outsides of such structures are illustrated with dashed lines.

While the aisles have been illustrated in the preceding figures as having similar lengths, different aisles may have different lengths without departing from embodiments disclosed herein.

In the foregoing specification, embodiments have been described with reference to specific exemplary example embodiments thereof. It will be evident that various modifications may be made thereto without departing from the broader spirit and scope of the embodiments as set forth in the following claims. The specification and drawings are, accordingly, to be regarded in an illustrative sense rather than a restrictive sense.

What is claimed is:

1. A containment system for operating a two phase immersion cooling system with a coolant to cool computing devices positioned in immersion tanks, the containment system comprising:
   a first immersion tank aisle comprising:
      an information technology (IT) space for storing the immersion tanks, and
      an access space that runs along a length of the first immersion tank aisle and from which each of the immersion tanks in the IT space can be physically accessed;
   a vapor management aisle positioned above the first immersion tank aisle to receive vapor that rises from the first immersion tank aisle, the vapor management aisle comprising:
      a vapor return unit configured to condense the vapor into the coolant;
   a service aisle positioned next to the first immersion tank aisle;
   a rear side service entrance through which the immersion tanks are moved into the IT space, wherein the rear side service entrance is positioned between the first immersion tank aisle and the service aisle;
   a second immersion tank aisle substantially similar to the first immersion tank aisle, wherein the second immersion tank aisle and the first immersion tank aisle are positioned on opposite side of the service aisle, and the second immersion tank aisle is positioned and oriented to mirror the first immersion tank aisle across the service aisle; and
   another vapor management aisle, the another vapor management aisle being positioned above the second immersion tank aisle to receive a portion of the vapor that rises from a portion of the immersion tanks positioned in the second immersion tank aisle.

2. The containment system of claim 1, further comprising:
   a distribution system positioned with the service aisle, the distribution system configured to obtain the coolant from the vapor return unit and distribute the coolant to the immersion tanks.

3. The containment system of claim 2, wherein the distribution system is further configured to distribute the coolant to other immersion tanks in another service aisle.

4. The containment system of claim 2, wherein the coolant is distributed to device spaces of the immersion tanks to submerge, at least in part, and the computing devices being positioned in the device spaces.

5. The containment system of claim 1, wherein the vapor management aisle is also positioned above the second immersion tank aisle to receive the vapor from the first immersion tank aisle and the second immersion tank aisle.

6. The containment system of claim 1, further comprising:
   wherein the vapor management aisle and the other vapor management aisle are both in fluid communication with a distribution system to distribute the coolant from the both the vapor management aisle and the other vapor management aisle to the portion of the immersion tanks positioned in the second immersion tank aisle and another portion of the immersion tanks positioned in the first immersion tank aisle.

7. The containment system of claim 1, wherein the vapor management aisle further comprises:
   a motion system positioned with the vapor return unit, the motion system configured to move the vapor return unit along a length of the vapor management aisle,
   wherein the vapor management aisle is configured to condense a portion of the vapor that is proximate to the vapor return unit without condensing other portions of the vapor in the vapor management aisle that are not proximate to the vapor return unit,
   wherein the motion system is configured to move the vapor return unit along the length of the vapor management aisle by sequentially moving the vapor return unit to predetermined locations along the length, pausing for durations of time corresponding to the predetermined locations, and then continuing the moving of the vapor return unit after each pausing to condense all of the portions of the vapor in the vapor management aisle over time.

8. The containment system of claim 7, wherein at least a portion of the predetermined locations correspond to immersion tank locations in the IT space for the immersion tanks.

9. The containment system of claim 7, wherein the vapor return unit has a first length that is a fraction of a second length of the vapor management aisle and is unable to condense all of the vapor in the vapor management aisle while positioned at any single location along the second length of the vapor management aisle.

10. The containment system of claim 9, further comprising:
   an opening between the first immersion tank aisle and the vapor management aisle, the opening positioned to direct different rising portions of the vapor to different locations along the length of the vapor management aisle.

11. The containment system of claim 7, wherein the vapor return unit comprises a mobile condenser that moves with the vapor return unit, the mobile condenser being configured to condense the vapor into the coolant, and the mobile condenser being in fluid communication with a source of cooling fluid to operate the mobile condenser with flexible lines to provide for substantially continuous fluid communication between the mobile condenser and the source of the cooling fluid while the vapor return unit moves.

12. The containment system of claim 1, wherein
   the first immersion tank aisle, a second immersion tank aisle substantially similar to the first immersion tank aisle, and a service aisle positioned between the first immersion tank aisle and the second immersion tank aisle are implemented as a first module, the vapor management aisle is implemented as a second module, and the first module and the second module are complementary to each other to assemble the containment system into an operational configuration by positioning and orienting the second module with respect to the first module.

13. A data center system, comprising:
computing devices cooled with coolant in immersion tanks;
a first immersion tank aisle comprising:
an information technology (IT) space for storing the immersion tanks, and
an access space that runs along a length of the first immersion tank aisle and from which each of the immersion tanks in the IT space can be physically accessed;
a vapor management aisle positioned above the first immersion tank aisle to receive vapor that rises from the first immersion tank aisle, the vapor management aisle comprising:
a vapor return unit configured to condense the vapor into the coolant;
a service aisle positioned next to the first immersion tank aisle; and
a rear side service entrance through which the immersion tanks are moved into the IT space, wherein the rear side service entrance is positioned between the first immersion tank aisle and the service aisle;
a second immersion tank aisle substantially similar to the first immersion tank aisle, wherein the second immersion tank aisle and the first immersion tank aisle are positioned on opposite side of the service aisle, and the second immersion tank aisle is positioned and oriented to mirror the first immersion tank aisle across the service aisle; and
another vapor management aisle, the another vapor management aisle being positioned above the second immersion tank aisle to receive a portion of the vapor that rises from a portion of the immersion tanks positioned in the second immersion tank aisle.

14. The data center system of claim 13, wherein the vapor management aisle further comprises:
a motion system positioned with the vapor return unit, the motion system configured to move the vapor return unit along a length of the vapor management aisle,
wherein the vapor management aisle is configured to condense a portion of the vapor that is proximate to the vapor return unit without condensing other portions of the vapor in the vapor management aisle that are not proximate to the vapor return unit,
wherein the motion system is configured to move the vapor return unit along the length of the vapor management aisle by sequentially moving the vapor return unit to predetermined locations along the length, pausing for durations of time corresponding to the predetermined locations, and then continuing the moving of the vapor return unit after each pausing to condense all of the portions of the vapor in the vapor management aisle over time.

15. The data center system of claim 14, wherein the vapor return unit comprises a mobile condenser that moves with the vapor return unit, the mobile condenser being configured to condense the vapor into the coolant, and the mobile condenser being in fluid communication with a source of cooling fluid to operate the mobile condenser with flexible lines to provide for substantially continuous fluid communication between the mobile condenser and the source of the cooling fluid while the vapor return unit moves.

16. A modularized containment system for operating a two phase immersion cooling system with a coolant to cool computing devices positioned in immersion tanks, comprising:
a first module comprising:
a first immersion tank aisle comprising:
an information technology (IT) space for storing the immersion tanks, and
an access space that runs along a length of the first immersion tank aisle and from which each of the immersion tanks in the IT space can be physically accessed;
a second immersion tank aisle substantially similar to the first immersion tank aisle; and
a service aisle positioned between the first immersion tank aisle and the second immersion tank aisle;
a rear side service entrance through which the immersion tanks are moved into the IT space, wherein the rear side service entrance is positioned between the first immersion tank aisle and the service aisle; and
first openings positioned with the first immersion tank aisle and the second immersion tank aisle;
a second module comprising:
a vapor management aisle positioned to receive vapor that rises from the first immersion tank aisle and/or the second immersion tank aisle, the vapor management aisle comprising:
a vapor return unit configured to condense the vapor into the coolant; and
second openings complementary to the first openings to direct the vapor rising through the first openings and the second openings while the first module and second module are positioned to operate a containment system.

17. The modularized containment system of claim 16, wherein the vapor management aisle further comprises:
a motion system positioned with the vapor return unit, the motion system configured to move the vapor return unit along a length of the vapor management aisle,
wherein the vapor management aisle is configured to condense a portion of the vapor that is proximate to the vapor return unit without condensing other portions of the vapor in the vapor management aisle that are not proximate to the vapor return unit,
wherein the motion system is configured to move the vapor return unit along the length of the vapor management aisle by sequentially moving the vapor return unit to predetermined locations along the length, pausing for durations of time corresponding to the predetermined locations, and then continuing the moving of the vapor return unit after each pausing to condense all of the portions of the vapor in the vapor management aisle over time.

18. The modularized containment system of claim 17, wherein the vapor return unit comprises a mobile condenser that moves with the vapor return unit, the mobile condenser being configured to condense the vapor into the coolant, and the mobile condenser being in fluid communication with a source of cooling fluid to operate the mobile condenser with flexible lines to provide for substantially continuous fluid communication between the mobile condenser and the source of the cooling fluid while the vapor return unit moves.

\* \* \* \* \*